(12) United States Patent
Lasser

(10) Patent No.: US 9,355,732 B2
(45) Date of Patent: May 31, 2016

(54) LATCH INITIALIZATION FOR A DATA STORAGE DEVICE

(71) Applicant: SANDISK TECHNOLOGIES INC., Plano, TX (US)

(72) Inventor: Menahem Lasser, Kohav-Yair (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/504,268

(22) Filed: Oct. 1, 2014

(65) Prior Publication Data

US 2016/0099065 A1    Apr. 7, 2016

(51) Int. Cl.
*G11C 16/10* (2006.01)
*G11C 16/20* (2006.01)
*G11C 11/56* (2006.01)

(52) U.S. Cl.
CPC ............ *G11C 16/20* (2013.01); *G11C 11/5671* (2013.01)

(58) Field of Classification Search
CPC ............................. G11C 16/10; G11C 11/5628
USPC ........................................ 365/185.03, 185.24
See application file for complete search history.

(56) References Cited

U.S. PATENT DOCUMENTS

| | | | | |
|---|---|---|---|---|
| 6,882,554 B2 * | 4/2005 | Markert | ................. | G11C 7/067 365/189.14 |
| 7,245,532 B2 * | 7/2007 | Jyouno | ................. | G11C 11/005 365/154 |
| 7,949,933 B2 * | 5/2011 | Nagai | ................. | G11C 7/1006 714/766 |
| 8,065,585 B1 * | 11/2011 | Abbaszadeh | ..... | H03M 13/2963 714/752 |
| 8,381,070 B2 * | 2/2013 | Arai | ................. | G06F 11/1048 714/763 |
| 8,400,830 B2 * | 3/2013 | Ishikawa | ................. | G11C 7/1006 365/185.03 |
| 8,533,562 B2 * | 9/2013 | Mee | ................. | G06F 11/1441 711/103 |
| 8,713,330 B1 | 4/2014 | Sommer et al. | | |
| 2003/0051197 A1 * | 3/2003 | Evans | ................. | G11C 29/12 714/718 |
| 2006/0114718 A1 * | 6/2006 | Jyouno | ................. | G11C 11/005 365/185.08 |
| 2007/0150644 A1 * | 6/2007 | Pinto | ................. | G11C 16/349 711/103 |
| 2010/0083065 A1 * | 4/2010 | Longwell | ................. | G06F 11/106 714/746 |
| 2010/0259983 A1 | 10/2010 | Yoon | | |
| 2011/0035539 A1 | 2/2011 | Honda | | |
| 2012/0243304 A1 | 9/2012 | Hoya | | |
| 2013/0124781 A1 | 5/2013 | Sadashivappa | | |
| 2014/0185364 A1 * | 7/2014 | Iyer | ................. | G11C 8/16 365/154 |

OTHER PUBLICATIONS

International Search Report and Written Opinion mailed Dec. 3, 2015 in International Application No. PCT/US2015/047967, 11 pages.

* cited by examiner

Primary Examiner — Michael Tran
(74) Attorney, Agent, or Firm — Toler Law Group, PC

(57) ABSTRACT

A data storage device may include a memory die. The memory die includes a memory and a latch. A method may include receiving a command corresponding to a write operation to write information to the memory. The method may further include loading a set of bits into the latch prior to receiving the information at the memory die. The set of bits includes at least a first bit having a first value and a second bit having a second value that is different than the first value. The method further includes receiving the information at the memory die and overwriting at least a portion of the set of bits at the latch with the information.

34 Claims, 4 Drawing Sheets

LATCH INITIALIZATION FOR A DATA STORAGE DEVICE

FIELD OF THE DISCLOSURE

The present disclosure is generally related to data storage devices and more particularly to latch initialization for data storage devices.

BACKGROUND

Non-volatile data storage devices have enabled increased portability of data and software applications. For example, multi-level cell (MLC) storage elements of a memory device may each store a value indicating multiple bits of data, enhancing data storage density as compared to single-level cell (SLC) memory devices. Consequently, memory devices may enable users to store and access a large amount of data. In some cases, the data may include sequences of consecutive values (e.g., a string of logic "0" values or a string of logic "1" values).

Storing a common value in multiple adjacent storage elements can degrade performance of a memory device, such as by causing a large leakage current in some memory devices. To illustrate, in a resistive-random access memory (ReRAM), programming a column of storage elements to a low-resistance state may produce a large leakage current. Further, storing a common value in multiple adjacent storage elements can cause disturb effects in some memory devices. For example, storage elements of a flash memory device may be more prone to cross-coupling effects (and thus read errors and decoding errors) if adjacent storage elements are programmed to a common value.

To avoid programming of a common value to adjacent storage elements, some memory devices scramble or shape data to be stored. In some cases, such a technique may still result in programming of a common value to adjacent storage elements, such as if a "gap" exists in data to be written (in which case a repeated sequence of "default" values may be written in place of the gap, such as a sequence of logic "0" values or of logic "1" values). Some memory devices may insert dummy data in such a gap to avoid programming of a default sequence of a common value. However, sending the dummy data from a controller to a memory may use a large amount of resources at a memory device (e.g., by using power to transfer the dummy data over a bus between the controller and the memory).

SUMMARY

A data storage device includes a memory die. The memory die may include a memory, a latch, and initialization circuitry that initializes the latch for a write operation that writes information to the memory. The latch may be initialized using a set of bits (e.g., a randomized bit sequence or a pattern) having multiple bit values (e.g., a first bit value and a second bit value that is different than the first bit value). For example, the set of bits may be a random or pseudorandom bit sequence that is generated by or retrieved from the memory die. After the set of bits is loaded into the latch, the information to be written to the memory may be provided to the latch (e.g., to overwrite the set of bits) by a controller of the data storage device or by a host device. The information may then be programmed to the memory, such as using read/write circuitry of the memory die.

If a bit length of the information is less than a storage size of the latch, then a "gap" may exist when the information to be stored in the memory is loaded into the latch. In this case, initializing the latch using a set of bits having multiple values may avoid programming of a sequence of common values to the memory (e.g., a default sequence of logic "0" values or of logic "1" values), thus reducing leakage current and/or read disturb effects at the memory (e.g., if a randomized bit sequence or a pattern that includes 1's and 0's is programmed to the adjacent storage elements instead of programming a common value to the adjacent storage elements). In some implementations, the memory may have a multi-level cell (MLC) configuration, and the information to be written to the memory may include multiple logical pages that are latched into multiple latches of the memory. In this case, a different randomized bit sequence may be used to initialize each of the latches prior to storing the multiple logical pages into the multiple latches. Other examples are described below with reference to the drawings.

DETAILED DESCRIPTION

Figure 1:
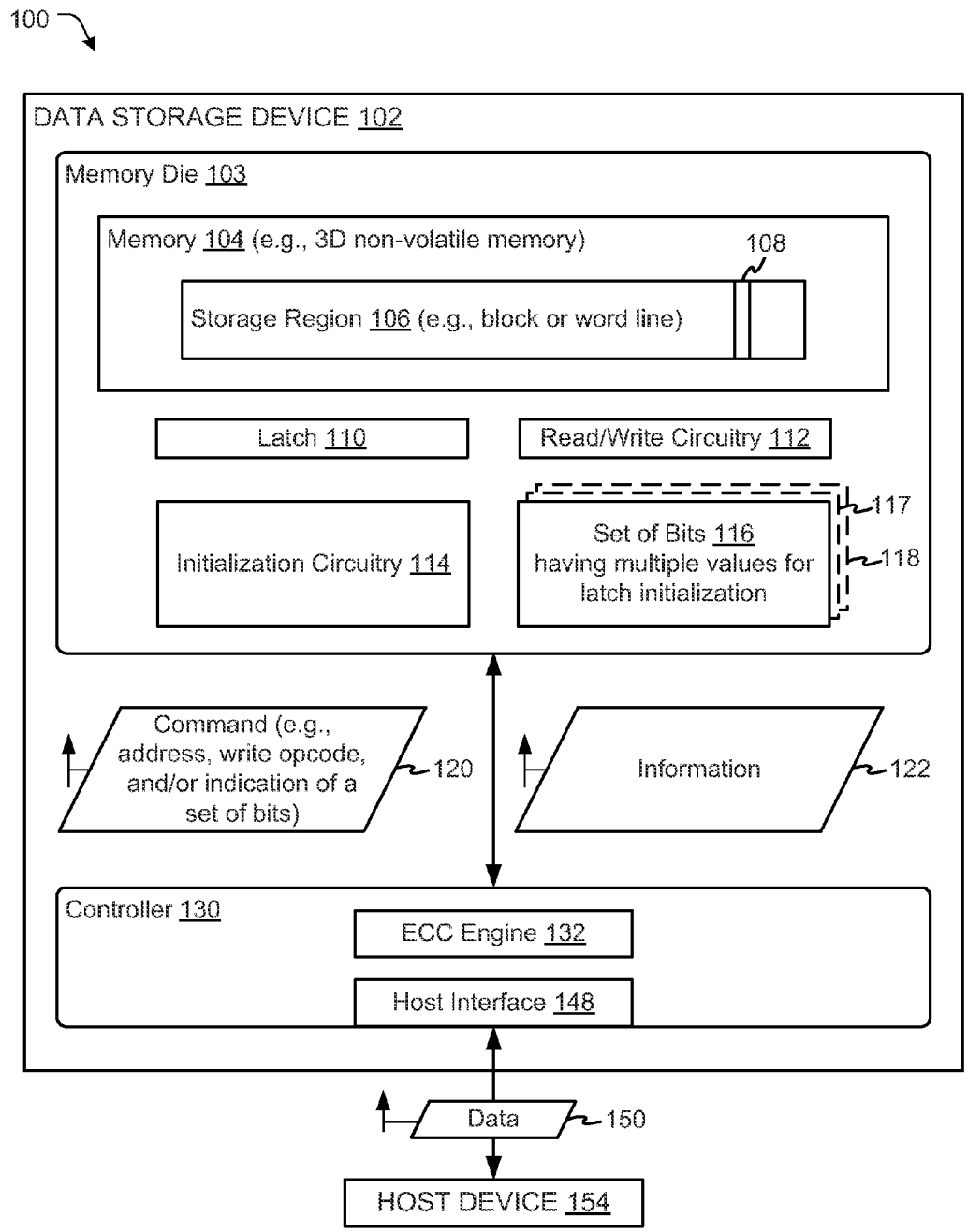
FIG. 1 is a block diagram of a particular illustrative embodiment of a system that includes a data storage device that may be configured to initialize a latch using a set of bits having multiple values.

A write process used by a non-volatile memory may use a multi-stage write process to write a page of data to the non-volatile memory. For example, the write process may include sending (e.g., by a memory controller or by a host computer) a write opcode to the memory die. The memory die may initialize a page-size volatile latch for receiving data to be written to the non-volatile memory. For example, the initialization may set all bits of the latch to a logic "1" state or to a logic "0" state. In some implementations, initializing the latch is performed after sending a destination address associated with the data to the memory die.

The memory controller or host computer may send one or more bytes specifying the address of the write operation. The address may include two elements: an identification of the page to be written (e.g., die number, plane number within the die, block number within the plane, and/or page number within the block) and an identification of the start location within the page (e.g., a byte number within the page, also referred to as column number). In some devices, the writing begins at the beginning of the page and the column number is zero.

The memory controller or host computer may send a sequence of data bytes to be written to the non-volatile memory. (In some memories, the bus width is 16 bits (e.g., two bytes or a word), so a sequence of words may be sent rather than a sequence of bytes.) The length of the data sequence may correspond to (e.g., be limited by) an amount of space between the starting location within the page (as specified by the received address) and the end of the page.

The memory die may insert the incoming data bytes into the initialized latch beginning at the column specified by the received address. If the sequence of written data bytes ends before reaching the end of the latch (i.e., if a bit length of the data is less than a capacity of the latch), the tail of the latch remains in the initialized state. Similarly, if the column number is greater than zero and insertion does not begin at the first byte, the head portion of the latch remains in the initialized state.

After inserting the data into the initialized latch, the memory controller or host computer may send an opcode indicating that the end of the data sequence has been reached and that programming of the data into the array of non-volatile memory cells is to be performed. In some cases, programming may begin before all of the data is inserted into the latch. The memory die may autonomously perform additional operations to store the contents of the latch into the page specified by the received address (e.g., using read/write circuitry of the memory die to write the contents of the latch to the page of the memory array). Such operations may be performed at a two-dimensional (2D) memory array or at a three-dimensional (3D) memory array.

For convenience of illustration, this example write process is described for the case in which the data is to be written into sequential locations within a targeted page. In other write processes, data may not be fully sequential. For example, the data may include one or more gaps. In this case, after one or more bytes (e.g., after a subsequence of sequential bytes), the data may "jump" or "skip" one or more bytes in the page, followed by another data sequence or subsequence. For the sake of simplicity, while certain examples are described with reference to the "no-gaps" case, it is noted that techniques described herein are also applicable to data sequences having one or more "gaps."

Some resistive random access memory (ReRAM) devices represent a logic value of "1" by a corresponding memory cell being programmed to a low resistance state and a logic value of "0" by a corresponding memory cell being programmed to a high resistance state. A cell in a low resistance state may cause a high leakage current (when neighboring cells are accessed) as compared to a cell in a high resistance state. Therefore, having a large number of ReRAM cells in a low resistance state consumes power. In addition, flash memories may be prone to disturbances (and consequently to data reading errors) when adjacent cells have a common state. Therefore, having a large number of cells in either an erased state or in a logic high state may reduce performance of a flash memory device (e.g., by causing disturbances and read errors).

To avoid high power consumption or reduced performance associated with programming a common state to adjacent memory cells, a memory controller or a host computer may randomize (or scramble) user data to be written prior to programming the data into the array of memory cells. However, even after randomizing user data, programming of the user data may still result in a large number of adjacent storage elements having a common state, such as when the user data includes one or more "gaps." For example, if a portion of a latch is initialized to a state (e.g., a logic "1" state) and is not altered by the write operation (e.g., is not overwritten by the user data due to a "gap" in the user data), then multiple adjacent memory cells may be programmed to a common state (e.g., the logic "1" state). The adjacent memory cells may be included in a tail portion of the page (if the user data ends before the end of the page) or in a head portion of the page (if the user data does not start at the beginning of the page). In other cases, the adjacent memory cells may be included in a middle of the page (e.g., if a "gap" exists in the middle of the data).

Some memory controllers insert randomized "dummy" data within user data so that unused portions of a page are programmed with the dummy data (instead of programming a common state to the unused portions of the page). For example, an unused head or tail of a page may be programmed with dummy data (instead of being programmed based on the initialized state of the latch). The dummy data may be latched into the latch and programmed to the non-volatile memory with the user data.

Use of dummy data may be associated with additional complexity and may utilize additional processing resources, power, and/or hardware. Further, transferring the dummy data over a bus between the memory die and the memory controller or host computer may utilize power and transfer time. For example, a table may be transferred to the memory die for storage at the non-volatile memory. The table may include multiple entries each including 512 bytes. Each entry may occupy one page, where a page size is 4 kilobytes (kB). Thus, for each byte of user data transferred to the memory die, the memory controller may transfer 8 bytes over the bus to the memory die (one byte of user data and seven bytes of dummy data), which may be inefficient. Therefore, it is useful to avoid the memory controller or the host computer transferring dummy data for unused portions of a page of memory, while still enabling "randomization" of the states of the memory cells corresponding to the unused portions.

In accordance with the present disclosure, an input latch of a memory die is initialized to a random pattern rather than to a pattern of identical bits. The initialization to a random pattern may be the "default" option, so that it occurs as a default for each write operation. Alternatively, the memory die may support both initialization to a random pattern and initialization of all bits to a common value (such as "1"). For example, the memory controller or the host computer may select between initialization to a random pattern and initialization to a common value.

Selection between the two options (i.e., between initialization to a random pattern or to a common value) may be performed using one or more techniques. As an example, each option may be associated with a respective write opcode. As another example, one option is selected as a default, and the other option may be designated by inserting a prefix before the write opcode. As another example, the memory die may store a global flag that indicates which of the two options is currently in effect. In this example, for each write operation, the latch may be initialized according to the state of the flag at the time the write operation is initiated. Commands may be used by the memory controller or the host computer to change the state of the flag.

In accordance with the present disclosure, data stored in any unwritten portion of a page (such as a head portion or a tail portion of the page) may be randomized without requiring sending dummy data into the memory die and without consuming energy and time associated with transferring the dummy data. The memory die may include hardware and/or instructions to generate and/or to store a random sequence of bits that are to be inserted into the input latch. Certain examples are described below for illustration and are not intended to be limiting.

In a first example, a pre-determined pattern of bits may be maintained at the memory die. The pattern may be equal in size to the length of a page, and the pattern may be copied into the input latch whenever the input latch is to be initialized.

In a second example, a pre-determined pattern of random bits is maintained at the memory die, and the pattern is smaller in size than a page. In this example, the pattern may be copied several times into the input latch whenever the input latch is to be initialized. For example, if the page size is 8 kB, the memory die may store a predetermined pattern of 2 kB and may load four copies of the pattern into the latch. The second example may save silicon area of the memory die as compared to the first example (because a smaller pattern is stored at the memory die).

In a third example, multiple bit patterns may be maintained for different logical pages of a multi-level cell (MLC) memory (e.g., upper, lower, and/or middle pages). To illustrate, in an MLC memory, it may be undesirable to have different logical pages associated with a common word line use the same pre-determined pattern. Accordingly, multiple pre-determined patterns may be utilized, with each pattern used for a specific logical page (e.g., for upper pages, for lower pages, or for middle pages).

To further illustrate, in connection with a two-bit-per-cell memory, one pattern may be associated with lower pages and another pattern may be associated with upper pages. In this case, the memory 104 may have a two-bit-per-cell MLC architecture, a write operation may be for writing an upper page or a lower page to the memory 104, and the set of bits 116 may be selected from multiple sets of bits associated with upper pages and lower pages. For a three-bit-per-cell memory, a first pattern may be associated with lower pages, a second pattern may be associated with middle pages, and a third pattern may be associated with upper pages. In this case, the memory 104 may have a three-bit-per-cell MLC architecture, a write operation may be for writing an upper page, a middle page, or a lower page to the memory 104, and the set of bits 116 may be selected from multiple sets of bits associated with upper pages, middle pages, and lower pages.

In a fourth example, multiple uncorrelated patterns are used for word lines of the memory. To illustrate, in some memories it is undesirable to have correlations of bit values along bit lines, because the correlated bit values might cause disturbances and other undesirable effects. In this case, use of the single predetermined pattern for all word lines may result in poor performance. In accordance with the fourth example, multiple different pre-determined patterns that are not correlated to each other may be used, with each pattern assigned to a different word line of a block. In an example implementation, the patterns may be smaller than the page size, and a pattern may be copied multiple times within a latch, such as described with reference to the second example.

In a fifth example, a number of patterns (and consequently the costs of storing the patterns) may be reduced by storing only a few patterns in the memory and repeating a pattern multiple times within a block. For example, if a block contains 64 word lines and 8 patterns are used, then a first pattern may be used for word lines 0, 8, 16, 24, 32, 40, 48 and 56, a second pattern is used for word lines 1, 9, 17, 25, 33, 41, 49 and 57, and so on. The number of patterns may be large enough to avoid correlation between two successive uses of the same pattern to avoid undesirable effects in the memory.

In a sixth example, a pattern to be used in a word line may be selected randomly or pseudo-randomly by the memory. For each write operation, one pattern may be selected at random from a list of pre-determined patterns.

In a seventh example, a pattern to be used in a word line may be selected by the memory controller or the host computer. For each write operation, a pattern may be selected by the memory controller or host computer from a list of pre-determined patterns. The memory controller or host computer may indicate the selection by issuing one of multiple write opcodes associated with respective different patterns, such as by adding different prefixes before the write commands, by adding a parameter to the write commands, by controlling a global parameter that indicates the current pattern to use, or by any other technique.

In an eighth example, a memory may avoid storing pre-determined patterns and instead the memory generates a new random pattern per each write command. In this example, a pattern may be randomly or pseudo-randomly generated on-the-fly at the memory die in response to each write command.

It is noted that certain memories may include built-in on-board scrambling circuitry that can randomize and de-randomize user data stored in an input latch, which is different than initializing the input latch for a write process before information is loaded into the input latch. Scrambling and de-scrambling inside a memory die is slower than scrambling and de-scrambling in a memory controller. For example, randomization is typically a sequential process in which previous bits along a page affect values of later bits, which can be complex to implement at a memory die. Latch operations within a memory die may be parallel in nature (e.g., copying data from one latch to another latch, which may be performed in parallel for all bits in a page). Scrambling and de-scrambling bits within a memory die may use dedicated sequential processing of bits, which may use a large number of operations, such as for a page having a long page length. If scrambling or de-scrambling is performed in a memory controller, the operations may be performed on-the-fly while the data is sequentially processed for other purposes. For example, data may be scrambled while the data is being moved to and processed by an error correction encoding module, or data may be de-scrambled while the data is being retrieved sequentially from a flash bus. Additionally, for memories that randomize the data along the bit-lines axis, the scrambling may become more complex and may be better implemented in the memory controller rather than in the memory die. Thus, use of on-board scrambling and de-scrambling at a memory die to randomize data at a latch may be inefficient. A latch initialization process in accordance with the present disclosure may randomize data using a pre-defined set of bits with multiple values (e.g., a randomized bit sequence) and may avoid large circuitry and complex operations to randomize data (as in some on-board scrambling and de-scrambling schemes).

Referring to FIG. 1, an illustrative example of a system is depicted and generally designated 100. The system 100 includes a data storage device 102 and a host device 154. The data storage device 102 and the host device 154 may be operationally coupled via a connection, such as a bus or a wireless connection. The data storage device 102 may be embedded within the host device 154, such as in accordance with a Joint Electron Devices Engineering Council (JEDEC) Solid State Technology Association Universal Flash Storage (UFS) configuration. Alternatively, the data storage device 102 may be removable from the host device 154 (i.e., "removably" coupled to the host device 154). As an example, the data storage device 102 may be removably coupled to the host device 154 in accordance with a removable universal serial bus (USB) configuration.

The data storage device 102 may include a memory die 103 and a controller 130. The memory die 103 and the controller 130 may be coupled via one or more buses, one or more interfaces, and/or another structure. An interface may be wired (e.g., a bus structure) or wireless (e.g., a wireless communication interface). Although FIG. 1 depicts a single memory die (the memory die 103) for convenience, it should be appreciated that the data storage device 102 may include another number of memory dies corresponding to the memory die 103 (e.g., two memory dies, eight memory dies, or another number of memory dies). Further, although FIG. 1 illustrates that the data storage device 102 includes the controller 130, in other implementations the memory die 103 may be directly coupled to the host device 154 (e.g., the host device 154 may include a controller or other device that accesses the memory die 103).

The memory die 103 includes a memory 104, such as a non-volatile memory. For example, the memory 104 may include a flash memory, such as a NAND flash memory, or a resistive memory, such as a resistive random access memory (ReRAM), as illustrative examples. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include one or more blocks of storage elements (also referred to herein as memory cells), such as one or more erase groups of storage elements. A block may include a plurality of bit lines and word lines connecting the storage elements. To illustrate, the memory 104 may include a storage region 106, which may correspond to one or more blocks or one or more word lines of storage elements, as illustrative examples. The storage region 106 may include multiple storage elements, such as a representative storage element 108. Each storage element of the storage region 106 (e.g., the storage element 108) may be programmable to a state (e.g., a threshold voltage or a resistive state) that indicates one or more bit values.

The memory die 103 may further include one or more latches (e.g., one or more data latches and/or one or more control latches). For example, the memory die 103 may include a latch 110. The latch 110 may correspond to a data latch that is configured to receive information from the controller 130 for write operations to the memory 104. The latch 110 may have a particular storage size or capacity, which may correspond to a storage size of each word line of the memory 104. It is noted that the memory die 103 may include more than one latch. For example, in an MLC configuration, the memory die 103 may include two latches (e.g., for a two-bit-per-cell implementation) or three latches (e.g., for a three-bit-per-cell implementation), as illustrative examples. In some configurations, a number of latches of the memory die 103 may be greater than or less than a number of bits stored per cell (e.g., four latches in connection with a three-bit-per-cell implementation, as an illustrative example). The latch 110 may include volatile storage elements, such as volatile random access memory (RAM) storage elements. FIG. 1 also illustrates that the memory die 103 may further include read/write circuitry 112 and initialization circuitry 114. The read/write circuitry 112 and the initialization circuitry 114 may be coupled to the latch 110.

The controller 130 may include an error correcting code (ECC) engine 132 and a host interface 148. The controller 130 may be coupled to the host device 154 via the host interface 148.

The controller 130 is configured to receive data and instructions from the host device 154 and to send data to the host device 154. For example, the controller 130 may receive data from the host device 154 via the host interface 148 and may send data to the host device 154 via the host interface 148.

The controller 130 is configured to send data and commands to the memory 104 and to receive data from the memory 104. For example, the controller 130 is configured to send data and a write command to cause the memory 104 to store the data to a specified address of the memory 104. The write command may specify a physical address of a portion of the memory 104 that is to store the data. The controller 130 is configured to send a read command to the memory 104 to access data from a specified address of the memory 104. The read command may specify the physical address of a portion of the memory 104.

The ECC engine 132 may be configured to receive data and to generate one or more ECC codewords based on the data. The ECC engine 132 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof. The ECC engine 132 may be configured to decode data accessed from the memory 104. For example, the ECC engine 132 may be configured to decode data accessed from the memory 104 to detect and correct one or more errors that may be present in the data, up to an error correcting capacity of the particular ECC scheme. The ECC engine 132 may include a Hamming decoder, an RS decoder, a BCH decoder, an LDPC decoder, a turbo decoder, a decoder configured to decode data according to one or more other ECC schemes, or a combination thereof.

In a particular embodiment, the data storage device 102 includes a scrambler configured to "scramble" values of data to be written to the memory 104. The scrambler may be included in the controller 130 or the memory die 103, as illustrative examples. For example, the controller 130 may include a scrambler that scrambles data prior to the controller 130 sending the data to the memory die 103 for storage. As another example, the memory die 103 may include a scrambler that scrambles data after latching of the data at the latch 110.

The host device 154 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The host device 154 may communicate via a host controller, which may enable the host device 154 to communicate with the data storage device 102. The host device 154 may operate in compliance with a JEDEC Solid State Technology Association industry specification, such as an embedded MultiMedia Card (eMMC) specification or a Universal Flash Storage (UFS) Host Controller Interface specification. The host device 154 may operate in compliance with one or more other specifications, such as a Secure Digital (SD) Host Controller specification as an illustrative example. Alternatively, the host device 154 may communicate with the data storage device 102 in accordance with another communication protocol.

During operation, the controller 130 may receive data 150 and a request for write access to the memory 104 from the host device 154. The controller 130 may input the data 150 to the ECC engine 132. The ECC engine 132 may encode the data 150 to generate information 122 (e.g., one or more ECC codewords).

Prior to sending the information 122 to the memory die 103 for storage at the memory 104, the data storage device 102 may initiate an initialization process. The initialization circuitry 114 may be configured to perform the initialization process to initialize the latch 110. For example, the initialization circuitry 114 may be configured to load a set of bits 116 into the latch 110. The set of bits 116 includes at least a first bit having a first value and a second bit having a second value that is different than the first value. For example, the set of bits 116 may include one or more logic "0" bits and may further include one or more logic "1" bits.

The set of bits 116 may be a random or a pseudorandom bit sequence that is retrieved from or generated by the memory die 103 prior to receiving the information 122 (and prior to writing data associated with the command 120, such as the information 122, to the memory 104). In this case, the set of bits 116 may include a random or pseudorandom arrangement of logic "0" bits and logic "1" bits. The set of bits 116 may be retrieved from the memory 104, or from another location of the memory die 103, such as a read-only memory (ROM) (not shown in FIG. 1) that stores the set of bits 116. For example, the initialization circuitry 114 may be configured to retrieve the set of bits 116 from the memory die 103 (prior to loading the set of bits 116 into the latch 110) and to load the set of bits 116 into the latch 110 after retrieving the set of bits 116. The set of bits 116 may correspond to a "default" state of the latch 110 prior to receiving information associated with a write operation, and the initialization circuitry 114 may initialize the latch 110 to the "default" state prior to the write operation.

The initialization circuitry 114 may be configured to perform the initialization process in response to receiving a command 120 from the controller 130. The command 120 indicates that a write process that writes the information 122 to the memory 104 is to occur. For example, the command 120 may indicate that the write process is scheduled to occur and that the memory die 103 is to initialize the latch 110 to receive the information 122. The command 120 may indicate an address associated with the write operation that is to write the information 122 to the memory 104 (e.g., a physical address of a page of the memory 104, such as a page index associated with the page). Alternatively or in addition, the command 120 may indicate a write opcode associated with the write operation.

The initialization circuitry 114 may be configured to detect the command 120 (e.g., by detecting the address and/or the write opcode) and to initialize the latch 110 using the set of bits prior to receiving the information 122. Depending on the particular implementation, the initialization process may be performed using particular structures and operations that can be selected based on the particular application. Certain examples of initialization processes are described below for illustration. It should be appreciated that the examples are illustrative and are not intended to be exhaustive or limiting.

According to a first example, the set of bits 116 has a bit length (i.e., a number of bits) that is equal to a page length associated with a page of the memory 104. For example, a storage size of each word line of the memory 104 may be associated with the page length (i.e., may be configured to store pages having the page length). In this example, the information 122 may correspond to a single page to be written to the memory 104, and the set of bits 116 and the information 122 may have a common bit length.

According to a second example, the set of bits 116 includes multiple copies of a particular bit pattern, and the particular bit pattern has a bit length that is less than a page length associated with the memory 104. In this example, the initialization circuitry 114 may be configured to "copy" the particular bit pattern a positive number of n times to produce the set of bits 116. To illustrate, if the page length (or word line size) is equal to a positive integer number of x bits and the bit length of the particular bit pattern is equal to x/n, then the initialization circuitry 114 may be configured to copy (e.g., concatenate) the particular bit pattern n times to produce the set of bits 116.

In other examples, the data storage device 102 is configured to store multiple sets of bits. For example, the memory die 103 may optionally store a second set of bits 117 and a third set of bits 118 in addition to the set of bits 116. Each of the sets of bits 116, 117, and 118 may include a different (e.g., unique) bit sequence. The set of bits 117 may include at least a first bit having a first value and a second bit having a second value that is different than the first value. For example, the set of bits 117 may include one or more logic "0" bits and may further include one or more logic "1" bits. The set of bits 118 may include at least a first bit having a first value and a second bit having a second value that is different than the first value. For example, the set of bits 118 may include one or more logic "0" bits and may further include one or more logic "1" bits. The memory die 103 may be configured to select between the sets of bits 116, 117, and 118, such as described further with additional examples below.

According to a third example, the memory 104 has an MLC architecture, and the information 122 includes an upper page, a middle page, and/or a lower page. For example, if the memory 104 has a two-bit-per-cell architecture, the information 122 may include two logical pages (an upper page and a middle page). The two logical pages may be written to a common word line of the memory 104. As another example, if the memory 104 has a three-bit-per-cell architecture, the information 122 may include three logical pages (an upper page, a middle page, and a lower page). The three logical pages may be written to a common word line of the memory 104. The initialization circuitry 114 may be configured to select the set of bits 116 from multiple sets of bits stored at the memory die 103. The multiple sets of bits may include a first set of bits corresponding to upper pages (e.g., the set of bits 116, which may initialize a first latch to receive an upper page of the information 122), a second set of bits corresponding to lower pages (e.g., the set of bits 117, which may initialize a second latch to receive a middle page of the information 122), and/or a third set of bits corresponding to middle pages (e.g., the set of bits 118, which may initialize a third latch to receive a lower page of the information 122). Alternatively, a common latch may be used for lower pages, upper pages, and middle pages, in each case being initialized with a different set of bits (e.g., the set of bits 116, the set of bits 117, or the set of bits 118).

According to a fourth example, the command 120 indicates an address of the memory 104, and the initialization circuitry 114 is configured to select the set of bits 116 from multiple sets of bits based on the address indicated by the command 120. To illustrate, the address may include a page index indicating a particular page (e.g., word line group of storage elements) within a particular block of the memory 104. The particular block may correspond to the storage region 106 or another region of the memory 104. Each page of the block may be associated with a respective set of bits of the multiple sets of bits (e.g., one of a positive integer number of k sets of bits of k pages of the block). In this case, the initialization circuitry 114 may be configured to select from the sets of bits based on the page index. In a 3D memory implementation of the memory die 103, each page of the block may be associated with a different "level" of the memory die 103 (e.g., distance from a substrate of the memory die 103).

According to a fifth example, the multiple sets of bits correspond to subsets of pages of the particular block (e.g., instead of a one-to-one correspondence of sets of bits to pages, as in the fourth example). In this case, the multiple sets of bits may include sets of bits that are reserved for corresponding pages of the memory 104. For example, the multiple sets of bits may include a first set of bits reserved for a first subset of pages associated with a first set of page indices and may further include a second set of bits reserved for a second subset of pages associated with a second set of page indices. For example, the first set may include pages associated with even-numbered indices and the second set may include pages associated with odd-number indices, as an illustrative example.

According to a sixth example, the initialization circuitry 114 is configured to randomly or pseudo-randomly select the set of bits 116 from among multiple sets of bits in response to receiving the command 120. In an illustrative implementation, the initialization circuitry 114 may include a pseudorandom number generator (PRNG) that is configured to generate a number. The initialization circuitry 114 may select one of the multiple sets of bits based on the number.

According to a seventh example, the command 120 includes an indication identifying the set of bits 116 from among multiple sets of bits. In this case, the controller 130 (or the host device 154) may select the set of bits 116. The initialization circuitry 114 may be configured to select the set of bits 116 from the multiple sets of bits based on the indication. Depending on the particular implementation, the indication (and the command 120) may be received either from the controller 130 or from the host device 154.

According to an eighth example, the initialization circuitry 114 is configured to randomly or pseudo-randomly generate the set of bits in response to receiving the command 120. In this example, the initialization circuitry 114 may include a PRNG that is configured to randomly or pseudo-randomly generate the set of bits 116 in response to receiving the command 120.

In any of the foregoing examples, the initialization circuitry 114 may be configured to initialize the latch 110 by loading the set of bits 116 into the latch 110 in response to receiving the command 120. After the initialization circuitry 114 initializes the latch 110 (e.g., after completion of the initialization process), the controller 130 may initiate a write operation at the memory die 103. For example, the memory die 103 may send a message (e.g., in the form of a "ready" signal) to the controller 130 indicating that the latch 110 is ready to receive information (e.g., indicating that the initialization process is complete). In other implementations, the controller 130 may query the memory die 103 whether the initialization process is complete, or the controller 130 may initiate the write operation a particular time period after sending the command 120 (e.g., a particular number of clock cycles after sending the command 120). The controller 130 may initiate the write operation by sending the information 122 to the memory die 103. The information 122 may overwrite at least a portion of the set of bits 116 in the latch 110 (e.g., by altering one or more values of the set of bits 116 stored in the latch 110).

After the memory die 103 receives the information 122, the read/write circuitry 112 may store the information 122 (or a representation of the information 122) from the latch 110 to the memory 104. For example, the information 122 may be stored at the storage region 106. The read/write circuitry 112 may store the information 122 at the storage region 106 after the information 122 is received at the latch 110 and after the information 122 overwrites at least a portion of the set of bits 116 at the latch 110. The memory die 103 may return a status signal to the controller 130 indicating a status of the write operation (e.g., a pass status if the write operation was successful or a fail status if the write operation was unsuccessful, such as in the event of a power interruption or other error).

In some implementations, a set of bits having multiple values (e.g., the set of bits 116) is used to initialize the latch 110 for each write operation to the memory 104. In other implementations, selection may be made between one or more sets of bits having different values and a set of bits having a common value (e.g., a set of "0" bits or a set of "1" bits) with which to initialize the latch 110. For example, the memory die 103 may store a second set of bits (in addition to the set of bits 116), each bit in the second set of bits having a common value. For each write operation, selection may be made between the set of bits 116 or the second set of bits. For example, a first write opcode may be issued by the controller 130 (or by the host device 154) to instruct the initialization circuitry 114 to use the set of bits 116, and a second write opcode may be issued by the controller 130 (or by the host device 154) to instruct the initialization circuitry 114 to use the second set of bits. As another example, the initialization circuitry 114 may be configured to use the set of bits 116 as a default in response to a write opcode, and the second set of bits may be selected in response to a modification of the write opcode (e.g., if a prefix is inserted before the write opcode). As another example, the memory die 103 may store a global flag that indicates whether the set of bits 116 or the second set of bits is to be used to initialize the latch 110. In this example, for each write operation, the latch 110 may be initialized based on a value of the flag at the time the write operation is initiated. The controller 130 (or the host device 154) may be configured to adjust the value of the flag (e.g., by sending a command that indicates a value of the flag or that indicates to change the value of the flag).

The examples of FIG. 1 may enable reduction of leakage current and/or disturb effects at the memory 104 by reducing or avoiding programming of a common value to adjacent storage elements of the memory 104. For example, if a bit length of the information 122 is less than a storage size of the latch 110, then a "gap" may exist when the information 122 is loaded into the latch 110. Initializing the latch 110 using a set of bits having multiple values (e.g., using the set of bits 116) may reduce or eliminate a possibility that the "gap" results in programming of a sequence of common values to the memory 104, thus reducing leakage current and/or read disturb effects at the memory 104.

Although certain aspects of FIG. 1 are described separately for convenience, it should be appreciated that certain examples can be combined by one of skill in the art based on the particular application. To illustrate, the second example and the third example can be combined by copying a bit pattern into a latch multiple times (if the bit pattern has a bit length that is less than a storage size of the latch) for each latch. Thus, in this example, a different bit pattern may be used for each latch for an MLC write operation, and each bit pattern may be copied into a latch multiple times. Other combinations and modifications may be made without departing from the scope of the disclosure.

Figure 2:
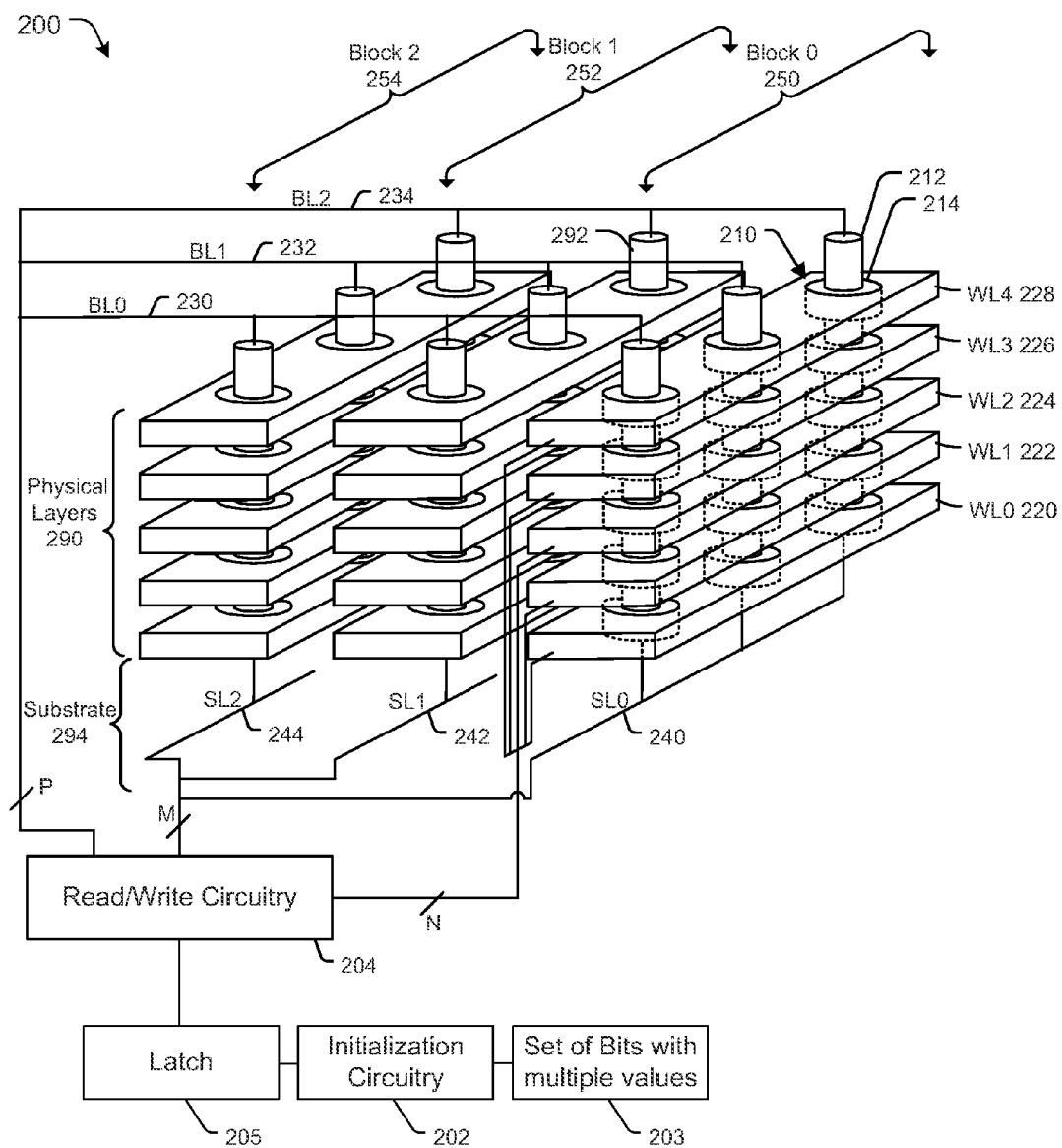
FIG. 2 is a diagram of an illustrative embodiment of a portion of a memory die that may be included in the data storage device of FIG. 1.

FIG. 2 illustrates a portion of a memory die 200 having a NAND flash configuration. The memory die 200 may be included in the data storage device 102 of FIG. 1. For example, the memory die 200 may correspond to the memory die 103 of FIG. 1. The memory die 200 may be coupled to the controller 130 of FIG. 1 (or to the host device 154 of FIG. 1).

The memory die 200 includes initialization circuitry 202, read/write circuitry 204, and one or more latches (e.g., a latch 205). The initialization circuitry 202 may be configured to initialize the latch 205 for a write operation using a set of bits 203 having multiple values. The initialization circuitry 202 may correspond to the initialization circuitry 114 of FIG. 1, the read/write circuitry 204 may correspond to the read/write circuitry 112 of FIG. 1, and the latch 205 may correspond to the latch 110 of FIG. 1. The set of bits 203 may correspond to any of the sets of bits 116, 117, and 118 of FIG. 1.

The memory die 200 includes multiple physical layers, such as a group of physical layers 290. The multiple physical layers are monolithically formed above a substrate 294, such as a silicon substrate. Storage elements (e.g., memory cells), such as a representative memory cell 210, are arranged in arrays in the physical layers.

The representative memory cell 210 includes a charge trap structure 214 between a word line/control gate (WL4) 228 and a conductive channel 212. Charge may be injected into or drained from the charge trap structure 214 via biasing of the conductive channel 212 relative to the word line 228. For example, the charge trap structure 214 may include silicon nitride and may be separated from the word line 228 and the conductive channel 212 by a gate dielectric, such as silicon oxide. An amount of charge in the charge trap structure 214 affects an amount of current through the conductive channel 212 during a read operation of the memory cell 210 and indicates one or more bit values that are stored in the memory cell 210.

The memory die 200 includes multiple erase blocks, including a first block (block 0) 250, a second block (block 1) 252, and a third block (block 2) 254. Each block 250-254 includes a "vertical slice" of the physical layers 290 that includes a stack of word lines, illustrated as a first word line (WL0) 220, a second word line (WL1) 222, a third word line (WL2) 224, a fourth word line (WL3) 226, and a fifth word line (WL4) 228. Multiple conductive channels (having a substantially vertical orientation with respect to FIG. 2) extend through the stack of word lines. Each conductive channel is coupled to a storage element in each word line 220-228, forming a NAND string of storage elements. FIG. 2 illustrates three blocks 250-254, five word lines 220-228 in each block, and three conductive channels in each block for clarity of illustration. However, the memory die 200 may have more than three blocks, more than five word lines per block, and more than three conductive channels per block.

The read/write circuitry 204 is coupled to the conductive channels via multiple conductive lines, illustrated as a first bit line (BL0) 230, a second bit line (BL1) 232, and a third bit line (BL2) 234 at a "top" end of the conducive channels (e.g., farther from the substrate 294) and a first source line (SL0) 240, a second source line (SL1) 242, and a third source line (SL2) 244 at a "bottom" end of the conductive channels (e.g., nearer to or within the substrate 294). The read/write circuitry 204 is illustrated as coupled to the bit lines 230-234 via "P" control lines, coupled to the source lines 240-244 via "M" control lines, and coupled to the word lines 220-228 via "N" control lines. Each of P, M, and N may have a positive integer value based on the specific configuration of the memory die 200. In the illustrative example of FIG. 2, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 292 and a particular source line may be coupled to the top of the conductive channel 212. The bottom of the conductive channel 292 may be coupled (e.g., electrically coupled) to the bottom of the conductive channel 212. Accordingly, the conductive channel 292 and the conductive channel 212 may be coupled in series and may be coupled to the particular bit line and the particular source line.

During a read operation, the controller 130 of FIG. 1 may receive a request from a host device, such as the host device 154 of FIG. 1. The controller 130 may cause the read/write circuitry 204 to read bits from particular storage elements of the memory die 200 by applying appropriate signals to the control lines to cause storage elements of a selected word line to be sensed. Accordingly, the memory die 200 may be configured to read from and write data to one or more storage elements.

During a write operation, the controller 130 of FIG. 1 may receive a request from a host device, such as the host device 154 of FIG. 1. The request may include data (e.g., the data 150 of FIG. 1) to be written at storage elements of the memory die 200. The controller 130 may send a command to the memory die 200 to cause the memory die 200 to initialize for the write operation. For example, the controller 130 may send the command 120 to the memory die 200, and the command 120 may cause the initialization circuitry 202 to load one or more sets of bits (e.g., the set of bits 203) into the latch 205.

After the initialization circuitry 202 initializes the latch 205, the controller 130 may send data (e.g., the information 122) to the memory die 200 to be written to storage elements of the memory die 200. For example, the controller 130 may latch the data into the latch 205 by overwriting the set of bits 203 in the latch 205 with the data.

The read/write circuitry 204 may be configured to access the data in the latch 205 and to program the data to storage elements of the memory die 200. For example, the read/write circuitry 204 may be configured to apply selection signals to control lines coupled to the word lines 220-228, the bit lines 230-234, and the source lines 240-242 to cause a programming voltage (e.g., a voltage pulse or series of voltage pulses) to be applied across one or more selected storage elements of the selected word line (e.g., the fourth word line 228, as an illustrative example).

Figure 3:
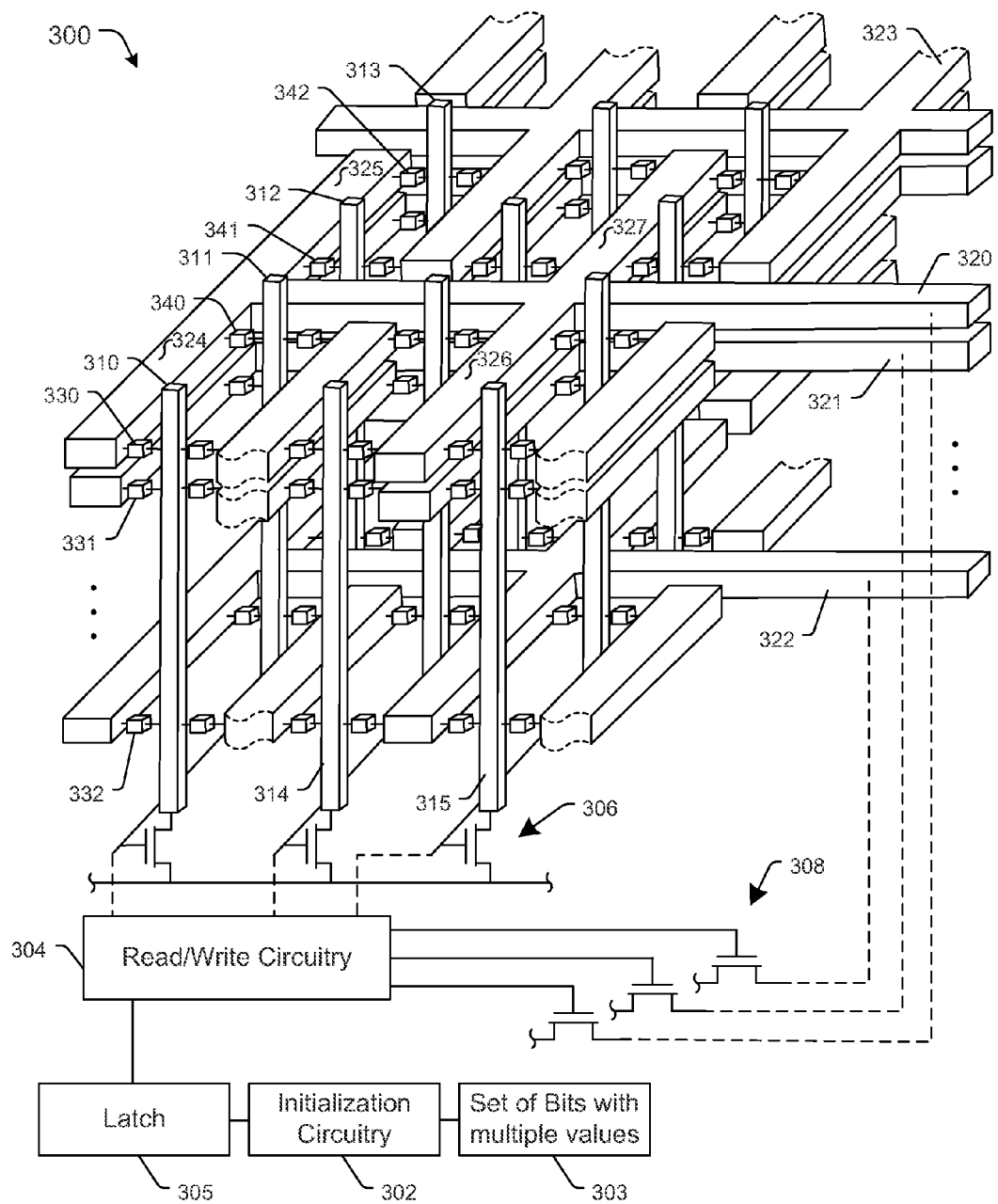
FIG. 3 is a diagram of another illustrative embodiment of a portion of a memory die that may be included in the data storage device of FIG. 1.

FIG. 3 illustrates a portion of a memory die 300 having a ReRAM configuration. The memory die 300 may be included in the data storage device 102 of FIG. 1. For example, the memory die 300 may correspond to the memory die 103 of FIG. 1. The memory die 300 may be coupled to the controller 130 of FIG. 1 (or to the host device 154 of FIG. 1).

The memory die 300 includes initialization circuitry 302, read/write circuitry 304, and one or more latches (e.g., a latch 305). The initialization circuitry 302 may be configured to initialize the latch 305 for a write operation using a set of bits 303 having multiple values. The initialization circuitry 302 may correspond to the initialization circuitry 114 of FIG. 1, the read/write circuitry 304 may correspond to the read/write circuitry 112 of FIG. 1, and the latch 305 may correspond to the latch 110 of FIG. 1. The set of bits 303 may correspond to any of the sets of bits 116, 117, and 118 of FIG. 1.

In the example of FIG. 3, the memory die 300 includes a vertical bit line (VBL) ReRAM with a plurality of conductive lines in physical layers over a substrate (e.g., substantially parallel to a surface of the substrate), such as representative word lines 320, 321, 322, and 323 (only a portion of which is shown in FIG. 3) and a plurality of vertical conductive lines through the physical layers, such as representative bit lines 310, 311, 312, and 313. The word line 322 may include or correspond to a first group of physical layers, and the word lines 320, 321 may include or correspond to a second group of physical layers.

The memory die 300 also includes a plurality of resistance-based storage elements (e.g., memory cells), such as representative storage elements 330, 331, 332, 340, 341, and 342. Each of the storage elements 330, 331, 332, 340, 341, and 342 is coupled to (or is associated with) a bit line and a word line in arrays of memory cells in multiple physical layers over the substrate (e.g., a silicon substrate).

In the example of FIG. 3, each word line includes a plurality of fingers. To illustrate, the word line 320 includes fingers 324, 325, 326, and 327. Each finger may be coupled to more than one bit line. For example, the finger 324 of the word line 320 is coupled to the bit line 310 via the storage element 330 at a first end of the finger 324, and the finger 324 is further coupled to the bit line 311 via the storage element 340 at a second end of the finger 324.

In the example of FIG. 3, each bit line may be coupled to more than one word line. To illustrate, the bit line 310 is coupled to the word line 320 via the storage element 330, and the bit line 310 is further coupled to the word line 322 via the storage element 332.

During a write operation, the controller 130 of FIG. 1 may receive data (e.g., the data 150 of FIG. 1) from a host device, such as the host device 154 of FIG. 1. The controller 130 may send a command to the memory die 300 to cause the memory die 300 to initialize for the write operation. For example, the controller 130 may send the command 120 to the memory die 300, and the command 120 may cause the initialization circuitry 302 to load one or more sets of bits (e.g., the set of bits 303) into the latch 305.

After the initialization circuitry 302 initializes the latch 305, the controller 130 may send data (e.g., the information 122) to the memory die 300 to be written to storage elements of the memory die 300. For example, the controller 130 may latch the data into the latch 305 by overwriting the set of bits 303 in the latch 305 with the data.

The read/write circuitry 304 may be configured to access the data in the latch 305 and to program the data to storage elements corresponding to the destination of the data. For example, the read/write circuitry 304 may apply selection signals to selection control lines coupled to the word line drivers 308 and the bit line drivers 306 to cause a write voltage to be applied across a selected storage element. As an illustrative example, to select the storage element 330, the read/write circuitry 304 may activate the word line drivers 308 and the bit line drivers 306 to drive a programming current (also referred to as a write current) through the storage element 330. To illustrate, a first write current may be used to write a first logical value (e.g., a value corresponding to a high-resistance state) to the storage element 330, and a second write current may be used to write a second logical value (e.g., a value corresponding to a low-resistance state) to the storage element 330. The programming current may be applied by generating a programming voltage across the storage element 330 by applying a first voltage to the bit line 310 and to word lines other than the word line 320 and by applying a second voltage to the word line 320. In a particular embodiment, the first voltage is applied to other bit lines (e.g., the bit lines 314, 315) to reduce leakage current in the memory die 300.

During a read operation, the controller 130 may receive a request from a host device, such as the host device 154 of FIG. 1. The controller 130 may issue a command to the memory die 300 specifying one or more physical addresses of the memory die 300.

The memory die 300 may cause the read/write circuitry 304 to read bits from particular storage elements of the memory die 300, such as by applying selection signals to selection control lines coupled to the word line drivers 308 and the bit line drivers 306 to cause a read voltage to be applied across a selected storage element. For example, to select the storage element 330, the read/write circuitry 304 may activate the word line drivers 308 and the bit line drivers 306 to apply a first voltage (e.g., 0.7 volts (V)) to the bit line 310 and to word lines other than the word line 320. A lower voltage (e.g., 0 V) may be applied to the word line 320. Thus, a read voltage is applied across the storage element 330, and a read current corresponding to the read voltage may be detected at a sense amplifier of the read/write circuitry 304. The read current corresponds (via Ohm's law) to a resistance state of the storage element 330, which corresponds to a logic value stored at the storage element 330. The logic value read from the storage element 330 and other elements read during the read operation may be provided to the controller 130 of FIG. 1 (e.g., via the latch 305).

Figure 4:
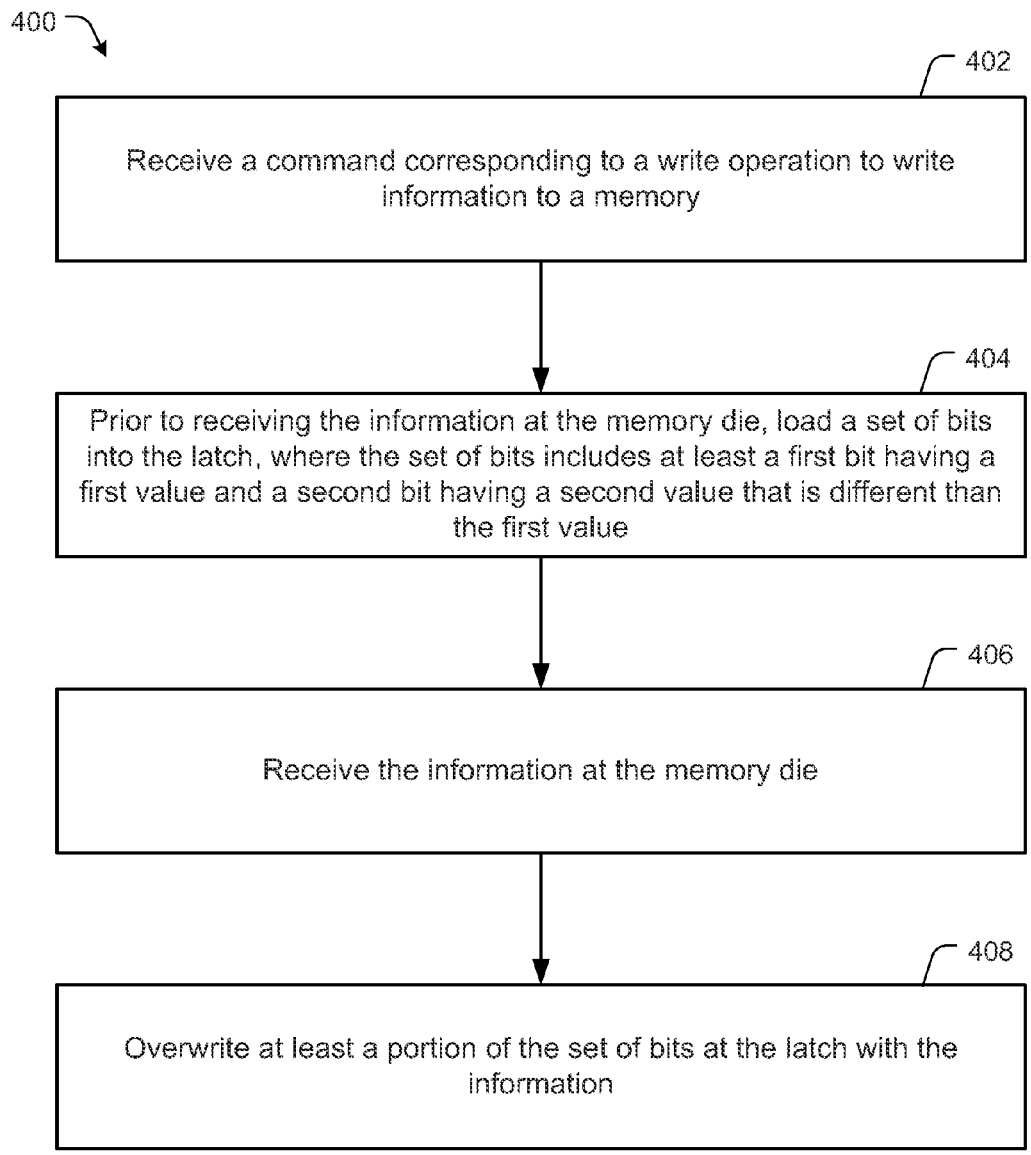
FIG. 4 is a flow diagram of an illustrative embodiment of a method of operation of the data storage device of FIG. 1.

Referring to FIG. 4, an illustrative example of a method is depicted and generally designated 400. The method 400 may be performed at a data storage device (e.g., the data storage device 102) that includes a memory die (e.g., any of the memory dies 103, 200, and 300). The memory die may include a memory (e.g., the memory 104) and a latch (e.g., any of the latches 110, 205, and 305).

The method 400 may include receiving a command corresponding to a write operation to write information to the memory, at 402. For example, the command may correspond to the command 120, which may cause the initialization circuitry 114 of FIG. 1 to initiate or perform an initialization process.

The method 400 may further include loading a set of bits into the latch prior to receiving the information at the memory die, at 404. The set of bits includes at least a first bit having a first value and a second bit having a second value that is different than the first value. For example, the set of bits may correspond to any of the sets of bits 116, 117, and 118 of FIG. 1.

The method 400 may further include receiving the information at the memory die, at 406. For example, the memory die 103 may receive the information 122 from the controller 130 of FIG. 1. The information 122 may be received in connection with a write operation to write the information 122 to the memory 104.

The method 400 may further include overwriting at least a portion of the set of bits at the latch with the information, at 408. For example, the information 122 may be stored at the latch 110, and the information 122 may overwrite one or more values of the set of bits 116 at the latch 110. Overwriting one or more values of the set of bits 116 may include altering one or more bit values of the set of bits 116 based on one or more bits of the information 122, such as by changing one or more "0" bits of the set of bits 116 to one or more "1" bits of the information 122. Alternatively or in addition, overwriting one or more values of the set of bits 116 may include changing one or more "1" bits of the set of bits 116 to one or more "0" bits of the information 122. After loading the information 122 in the latch 110, the memory die 103 may program the information 122 to the memory 104, such as by causing the read/write circuitry 112 to write values stored in the latch 110 to storage elements of the memory 104 (e.g., based on a physical address indicated by the command 120).

The example of FIG. 4 illustrates that a latch may be initialized for a write process by loading a set of bits (e.g., a predetermined randomized bit sequence) into the latch. The method 400 may be used to "randomize" information while avoiding sending of a large amount of "dummy" data between a controller and a memory. The method 400 may also enable a memory to reduce or avoid on-memory scrambling operations while still facilitating "randomization" of data programmed to the memory.

Although the controller 130 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein (e.g., the initialization circuitry 114) may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform operations described herein, such as one or more operations of the method 400 of FIG. 4. One or more operations described with reference to the initialization circuitry 114 may be implemented using a processor that executes instructions. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM).

It is also noted that certain characteristics of the data storage device 102 may be modified, such as using a firmware update or other update. To illustrate, as the data storage device 102 is operated, physical characteristics of the data storage device 102 may change (e.g., storage elements of the memory 104 may undergo physical degradation or wear). Change in physical characteristics may result in different operation of the data storage device 102, such as increased leakage current. Techniques described herein can be updated (e.g., via a firmware update), such as by increasing a number of sets of bits used to initialize the latch 110 of FIG. 1 (e.g., using four or five or more sets of bits to further decrease correlation of values between storage elements of the memory 104).

It should be appreciated that one or more operations described herein as being performed by the controller 130 may be performed at the memory 104. As an illustrative example, "in-memory" ECC operations may be performed at the memory die 103 alternatively or in addition to performing such operations at the controller 130.

The data storage device 102 may be attached to or embedded within one or more host devices, such as within a housing of a host communication device (e.g., the host device 154). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory. However, in other embodiments, the data storage device 102 may be implemented in a portable device configured to be selectively coupled to one or more external devices, such as the host device 154.

To further illustrate, the data storage device 102 may be configured to be coupled to the host device 154 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device that includes a memory die, wherein the memory die includes a memory and a latch, performing at the memory die:
   receiving a command corresponding to a write operation to write information to the memory;
   prior to receiving the information at the memory die, loading a set of bits into the latch, wherein the set of bits includes at least a first bit having a first value and a second bit having a second value that is different than the first value;
   receiving the information at the memory die; and
   overwriting at least a portion of the set of bits at the latch with the information.

2. The method of claim 1, wherein the set of bits includes a random or a pseudorandom bit sequence.

3. The method of claim 1, wherein the set of bits is retrieved from the memory die.

4. The method of claim 1, wherein the set of bits has a bit length that is equal to a page length associated with a page of the memory.

5. The method of claim 1, wherein the set of bits includes multiple copies of a particular bit pattern, wherein the particular bit pattern has a bit length that is less than a page length associated with the memory.

6. The method of claim 1, wherein the memory has a three-bit-per-cell multi-level cell (MLC) architecture, wherein the write operation is for writing an upper page, a middle page, or a lower page, and wherein the set of bits is selected from multiple sets of bits associated with upper pages, middle pages, and lower pages.

7. The method of claim 1, wherein the memory has a two-bit-per-cell multi-level cell (MLC) architecture, wherein the write operation is for writing an upper page or a lower page, and wherein the set of bits is selected from multiple sets of bits associated with upper pages and lower pages.

8. The method of claim 1, wherein the command indicates an address of the memory, and further comprising selecting the set of bits from multiple sets of bits based on the address.

9. The method of claim 8, wherein the address includes a page index indicating a particular page within a particular block of the memory, and wherein each page of the block is associated with a respective one of the multiple sets of bits.

10. The method of claim 8, wherein the multiple sets of bits include a first set of bits reserved for a first subset of pages associated with a first set of page indices and further include a second set of bits reserved for a second subset of pages associated with a second set of page indices.

11. The method of claim 1, further comprising randomly or pseudo-randomly selecting the set of bits from among multiple sets of bits in response to receiving the command.

12. The method of claim 1, wherein the command includes an indication identifying the set of bits from among multiple sets of bits.

13. The method of claim 12, wherein the indication is received from a controller coupled to the memory die or from a host device.

14. The method of claim 1, further comprising generating the set of bits in response to receiving the command.

15. The method of claim 14, wherein the set of bits is generated randomly or pseudo-randomly.

16. The method of claim 1, wherein the memory has a three-dimensional (3D) memory configuration that is monolithically formed in one or more physical levels of arrays of memory cells having an active area above a silicon substrate, and wherein the memory die includes circuitry associated with operation of the memory cells.

17. A data storage device comprising:
a memory;
a latch;
initialization circuitry, wherein the initialization circuitry is configured to load a set of bits into the latch to initialize the latch for a write process, and wherein the set of bits includes at least a first bit having a first value and a second bit having a second value that is different than the first value; and
read/write circuitry, wherein the read/write circuitry is configured to perform the write process at the memory after information is received at the latch and after the information overwrites at least a portion of the set of bits at the latch.

18. The data storage device of claim 17, wherein the initialization circuitry is further configured to load the set of bits into the latch in response to receiving a command from a host device and to retrieve the set of bits prior to loading the set of bits into the latch.

19. The data storage device of claim 17, wherein the set of bits includes a random or a pseudorandom bit sequence.

20. The data storage device of claim 17, wherein the set of bits has a bit length that is equal to a page length associated with a page of the memory.

21. The data storage device of claim 17, wherein the set of bits includes multiple copies of a particular bit pattern, wherein the particular bit pattern has a bit length that is less than a page length associated with the memory.

22. The data storage device of claim 17, wherein the memory has a three-bit-per-cell multi-level cell (MLC) architecture, wherein the write process is for writing an upper page, a middle page, or a lower page, and wherein the initialization circuitry is further configured to select the set of bits from multiple sets of bits associated with upper pages, middle pages, and lower pages.

23. The data storage device of claim 17, wherein the memory has a two-bit-per-cell multi-level cell (MLC) architecture, wherein the write process is for writing an upper page or a lower page, and wherein the initialization circuitry is further configured to select the set of bits from multiple sets of bits associated with upper pages and lower pages.

24. The data storage device of claim 17, wherein the initialization circuitry is further configured to select the set of bits from among multiple sets of bits based on an address of the memory associated with the write process.

25. The data storage device of claim 24, wherein the address includes a page index indicating a particular page within a particular block of the memory, and wherein each page of the block is associated with a respective one of the multiple sets of bits.

26. The data storage device of claim 24, wherein the multiple sets of bits include a first set of bits reserved for a first subset of pages associated with a first set of page indices and further include a second set of bits reserved for a second subset of pages associated with a second set of page indices.

27. The data storage device of claim 17, wherein the initialization circuitry is further configured to randomly or pseudo-randomly select the set of bits from among multiple sets of bits.

28. The data storage device of claim 17, wherein the initialization circuitry is further configured to receive an indication identifying the set of bits from among multiple sets of bits.

29. The data storage device of claim 28, wherein the indication is received either from a controller or from a host device.

30. The data storage device of claim 17, wherein the initialization circuitry is further configured to generate the set of bits.

31. The data storage device of claim 30, wherein the initialization circuitry is further configured to randomly or pseudo-randomly generate the set of bits.

32. The data storage device of claim 17, wherein the memory has a three-dimensional (3D) memory configuration that is monolithically formed in one or more physical levels of arrays of memory cells having an active area above a silicon substrate, and wherein the read/write circuitry is associated with operation of the memory cells.

33. An apparatus comprising:
a latch;
a memory having a three-dimensional (3D) memory configuration that is monolithically formed in one or more physical levels of arrays of memory cells having an active area above a silicon substrate;
initialization circuitry configured to load a set of bits into the latch to initialize the latch for a write process, the set of bits including at least a first bit having a first value and a second bit having a second value that is different than the first value; and write circuitry configured to perform the write process at the memory after information is received at the latch and after the information overwrites at least a portion of the set of bits at the latch, the write circuitry associated with operation of the memory cells.

34. The apparatus of claim 33, further comprising a controller configured to cause the initialization circuitry to initialize the latch in connection with the write process.

* * * * *